Dec. 16, 1958 J. L. JENSEN 2,864,904

SEMI-CONDUCTOR CIRCUIT

Filed Nov. 29, 1955

INVENTOR.
JAMES L. JENSEN

BY Frederick C. Lange

ATTORNEY 2,864,904

SEMI-CONDUCTOR CIRCUIT

James Lee Jensen, St. Louis Park, Minn., assignor to Minneapolis-Honeywell Regulator Company, Minneapolis, Minn., a corporation of Delaware Application November 29, 1955, Serial No. 549,700

5 Claims. (Cl. 179—171)

The present invention relates to semi-conductor amplifying devices and more particularly to an improved type of composite transistor amplifying device.

One of the circuit design problems encountered in transistor application is caused by the variation with temperature of the transistor collector leakage current, designated as "$Ic_0$." The variation in magnitude of $Ic_0$ with temperature is in many cases an exponential ratio, and is very undesirable. In transistor circuits designed to have zero output current in the absence of a signal, the minimum current which can be realized is determined by the leakage current of the transistor. In certain known circuits by application of the proper input signal potential, the transistor collector current can be reduced so that the current flowing in the collector circuit is limited to the fundamental leakage current $Ic_0$, by supplying this leakage current from the base electrode circuit. If on the other hand the base circuit current is zero, as is the case in an open base connection, the collector leakage current must be supplied from the emitter circuit, and the collector current can no longer be limited to $Ic_0$ but increases to $$\frac{Ic_0}{1-\alpha}$$

which term includes the amplification of the transistor, where $\alpha$ is defined as the ratio of the change in collector current to the change in emitter current at a constant collector potential. This factor is explained in detail in the text "Principles of Transistor Circuits" by Shea, copyright 1953 by John Wiley & Sons.

It has been proposed to combine several transistors into one unit to form a composite transistor in such art as a Patent 2,663,806 issued to Darlington. In applying the principles above described to the conventional composite transistor, above referenced, it is possible to reduce the collector leakage current to $Ic_0$ on only one of the transistors making up the composite unit, the second transistor of the composite unit then having zero base current flowing therein, and thereby acting essentially as an open base transistor circuit where the collector current of the second transistor of the composite unit is $$\frac{Ic_0}{1-\alpha}$$

An object of this invention is to provide a new and improved composite transistor circuit.

A more specific object of this invention is to provide a new and improved composite transistor in which each transistor of the composite unit may be cut off by the input signal simultaneously.

Specifically I accomplish this object by placing an impedance in parallel with the base-emitter electrodes of the first transistor thereby allowing the output current of both transistors of the composite unit to be cut off by the proper input signal.

Figure 1:
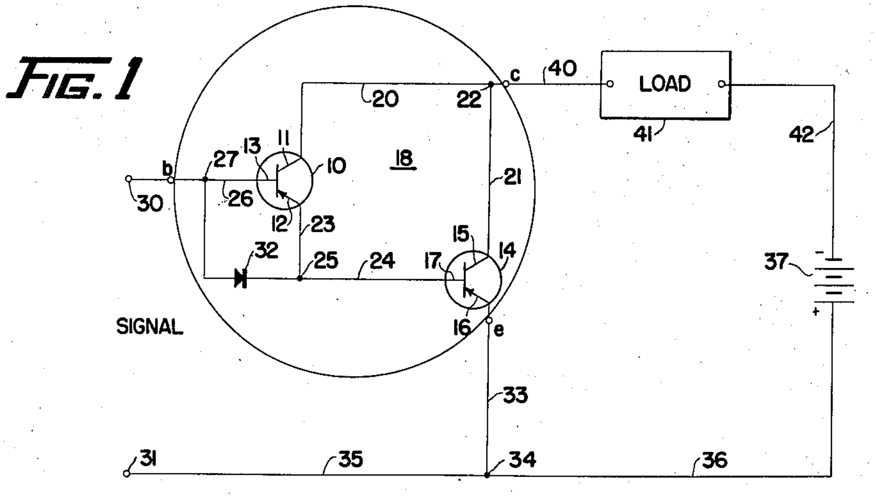
Figure 2:
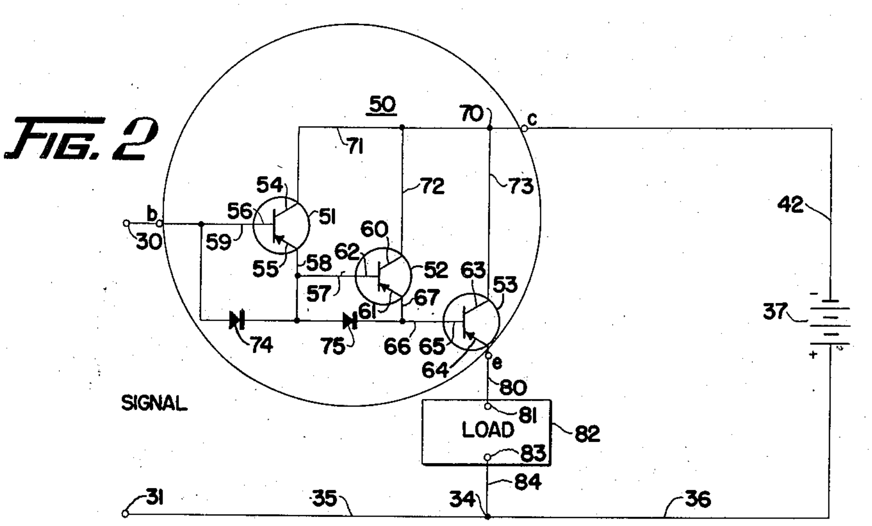

This and other objects of the present invention will be understood upon consideration of the accompanying specification, claims, and drawings of which:

Figures 1 and 2 are schematic representations embodying the invention.

Referring now to Figure 1 there is shown a composite transistor device 18 having collector, base and emitter terminals designated as *c*, *b*, and *e*, respectively, comprising a first transistor 10 which has a collector electrode 11, an emitter electrode 12, and a base electrode 13, and a second transistor 14 having a collector electrode 15, an emitter electrode 16 and a base electrode 17. The two collector electrodes 11 and 15 are connected through conductors 20 and 21, respectively, to a common junction 22. The emitter 12 of transistor 10 is directly connected to the base electrode 17 of transistor 14 by conductors 23 and 24. The base electrode 13 of transistor 10 is connected by a conductor 26 to an input terminal 30 of a pair of input terminals 30 and 31, which connect to a source of signal current, not shown. An impedance 32, here shown as a diode, is connected from a junction 27 on the conductor 26 to a junction 25 between conductors 23 and 24, and thus the diode is connected in parallel with the base emitter circuit of transistor 10. The emitter 16 of transistor 14 is connected through a conductor 33, a junction 34, and a conductor 35 to the other input terminal 31. Emitter 16 is also connected through the conductor 33, the junction 34, and a conductor 36 to the positive terminal of a source of potential 37, here shown as a battery. The common junction 22 which is directly connected to collectors 11 and 15 is connected to the negative terminal of battery 37 through a conductor 40, a suitable load device 41 and a conductor 42.

*Operation of Figure 1*

As is shown in Figure 1 the emitter 12 of transistor 10 is tied directly to the base electrode 17 of transistor 14, and the collector electrodes are directly connected together. Thus there is provided an equivalent or a composite transistor having emitter, collector, and base terminals which are lettered *e*, *c*, and *b* respectively, on the drawing. As is well known to those skilled in the art, the composite transistor has certain characteristics which are highly desirable, such as for example, an extremely high value of current multiplication factor, alpha, may be realized. For example, in the case of PNP junction transistors, if the alpha equals .9 for each unit the alpha for the composite transistor is .99. In this composite circuit it can be shown that the equation determining the alpha of the composite unit is $$\alpha=1-(1-\alpha_1)(1-\alpha_2)$$

where $\alpha_1$ and $\alpha_2$ are current multiplication factors for the individual transistors.

The composite transistor as known in the prior art had a limitation which limited greatly its value for basic circuit application. That limitation was, in effect, that it was possible to reduce the collector leakage current to the fundamental leakage current $Ic_0$ in only one of the individual transistors making up the composite unit. As is well known to those skilled in the art, in order to reduce the transistor collector current to a value of $Ic_0$ this magnitude of leakage current must be supplied from the base electrode circuit. If in the circuit of Figure 1 a positive potential is applied at input terminal 30 with respect to terminal 31, tending to reduce the conduction of the transistor to cut-off, the base collector leakage current $Ic_0$ of transistor 10 will be supplied from the input circuit, and the current in emitter 12 will be zero. If the action of diode 32 is ignored for the present, it will be seen that since the current in emitter 12 is zero then the current flowing in base 17 of transistor 14 must also be zero. It now becomes apparent that the collector leakage current of transistor 14 will not be limited to $Ic_0$ since the leakage current is not being provided from the base circuit but instead from the emitter circuit. The collector current flowing in transistor 14 will be $$\frac{Ic_0}{1-\alpha}$$

which, in other words, is the basic leakage current times the transistor current gain. This situation is extremely undesirable, and in this invention an impedance, in the form of a diode 32, has been connected from the base electrode 13 to the emitter electrode 12 of transistor 10, with the diode forward direction or easy current conducting direction opposite to the emitter-base diode of the transistor.

In this invention then, the addition of the diode 32 allows the leakage current $Ic_0$ to be supplied to both transistors from their respective bases when a positive potential is applied at input terminal 30, to reduce substantially to cutoff the transistor output current. By this method the collector current of each transistor is now limited to $Ic_0$. In addition the diode 32 has no detrimental effect on the characteristics of the composite transistor when a negative signal potential is applied to terminal 30, which signal tends to cause the transistor to conduct current to load 41.

In this invention the transistors have been shown as PNP junction transistors, however, the use of the diode to shunt the input circuit of the first transistor would be equally suitable for other type transistors used in a composite arrangement. Also in Figure 1 the composite transistor is shown as being connected in a common emitter configuration, that is, with the emitter electrode common to the input and output circuits, and having the load device in the collector circuit, however other configurations may be equally desirable. In addition, although the impedance 32 has been shown as a diode it is clear that any suitable impedance may be used.

*Figure 2*

Figure 2 is a modification of Figure 1 and shows the invention as applied to a three transistor composite transistor, having the load device in the composite transistor emitter circuit. Where the circuit is the same as Figure 1, the same identifying numerals are used as for Figure 1.

Referring now to Figure 2 there is shown generally at 50 a composite transistor having collector, emitter and base terminals designated as *c*, *e*, and *b*. The composite transistor comprises individual transistors 51, 52, and 53. Transistor 51 has a collector electrode 54, an emitter electrode 55 and a base electrode 56. Transistor 52 has a collector 60, an emitter 61 and a base electrode 62, and transistor 53 has a collector electrode 63, an emitter electrode 64 and a base electrode 65. Collector electrodes 54, 60 and 63 are directly connected to a common junction 70; collector 54 by a conductor 71, collector 60 by conductors 72 and 71 and collector 63 by a conductor 73. Base electrode 65 of transistor 53 is directly connected to emitter electrode 61 of transistor 52 by conductors 66 and 67. Likewise, base electrode 62 of transistor 52 is directly connected to the emitter electrode 55 of transistor 51 by conductors 57 and 58. A diode 74, or other suitable asymmetric current conducting device, is directly connected across the base-emitter electrodes of transistor 51, and a diode 75 is directly connected across the base-emitter electrodes of transistor 52.

Base electrode 56 of transistor 51 is directly connected to the input terminal 30 by a conductor 59. The common junction 70 of the collectors is directly connected by the conductor 42 to the negative terminal of the source of potential 37, shown as a battery. The positive terminal of battery 37 is connected through the conductor 36, the junction 34 and the conductor 35 to the other input terminal 31. Emitter electrode 64 of transistor 53, which is also the composite transistor emitter, is connected by a conductor 80 to one terminal 81 of a suitable load device 82. A second terminal 83 of the load device 82 is connected by a conductor 84 to the junction 34.

*Operation of Figure 2*

The operation of Figure 2 is basically identical with that explained for Figure 1. As has been previously described, diodes are placed across the base-emitter electrode to improve the operating characteristics of the composite transistor. Where more than two transistors are combined into a composite unit, as in Figure 2, it may become necessary to place a diode across the input circuit of each transistor, as shown. This allows all three transistors 51, 52 and 53 to be completely cut-off by the proper signal applied to the input so that only basic leakage current $Ic_0$ flows in each transistor. The diode 74 bypasses the input circuit of transistor 51 to allow transistor 52 to be cut-off and diodes 74 and 75 bypass transistors 51 and 52 allowing transistor 53 to be cut-off. It can be seen that by this method an inverse bias applied to input terminal 30 supplies the base-collector leakage current for all three transistors making up the composite unit.

Many modifications of Figure 2 are readily apparent. For example the diodes 74 and 75 may be connected in parallel from the base electrode 56; the second terminal of diode 74 being connected to base 62 of transistor 52 and the second terminal of diode 75 being connected to base-electrode 65. The load device 82 has been shown in the emitter circuit, however, this is a matter of design choice.

In general, while I have shown certain specific embodiments of my invention it is to be understood that this is for the purposes of illustration and that my invention is to be limited solely by the scope of the appended claims.

I claim:

1. Composite semi-conductor amplifying means comprising: first and second transistor means, each of said transistor means having a plurality of electrodes including a collector, an emitter and a base; means directly connecting together electrically said collector electrodes; asymmetric current conducting means; means directly connecting the base of said second transistor means to the emitter of said first transistor means; input signal means including a first and second terminal connected intermediate, respectively, said first transistor base and said second transistor emitter; means connecting said asymmetric current conducting means from the first terminal of said input means to the base of said second transistor means, said asymmetric conducting means being connected so that the direction of easy current flow is towards the base of the second transistor means; and output means connected to said collectors and to said second transistor means emitter electrode.

2. Composite transistor means comprising: first and second transistors of like conductivity type, each of said transistors including a base, a collector and an emitter electrode; means directly connecting the collector electrodes together; means directly connecting the emitter electrode of one transistor to the base electrode of the second transistor; means connecting the base electrode of said first transistor to a first terminal of signal input means; asymmetric current conducting means connected between said first terminal and the base electrode of said second transistor; and connections to the other emitter electrode.

3. A composite transistor device comprising: a plurality of transistors, each of said transistors having a plurality of electrodes including a collector, an emitter, and a base; means directly connecting together the collectors of said plurality of transistors; means connecting the emitter of each transistor to the base of the next succeeding transistor of said plurality; asymmetric current conducting means connected from the base of said first transistor to the base of each succeeding transistor; and input and output terminals connected to the electrodes of said composite device.

4. A composite semi-conductor signal translating device having a plurality of terminals comprising: first and second semi-conductor amplifying means, each of said amplifying means having a plurality of electrodes including a collector, an emitter, and a base, said semi-conductor means being subject to a collector-base leakage current; asymmetric current conducting means; said first and second semi-conductor amplifying means together with said asymmetric current conducting means comprising a composite signal translating device; means directly connecting said collectors to a common junction point, said junction forming the collector electrode of said composite unit; means directly connecting the base of said second semi-conductor means to the emitter of said first semi-conductor means; connection means to said second semi-conductor means emitter forming the emitter terminal of said composite device; input connection means to said first semi-conductor base electrode to form said composite device base terminal; and means connecting said asymmetric current conducting means intermediate said input connection means and the base electrode of said second semi-conductor amplifying means, said asymmetric conducting means being connected so that the direction of easy current flow provides a relatively low impedance path for the second semi-conductor leakage current from said input connection means.

5. A signal translating device comprising: first, second and third transistors of like conductivity type, each of said transistors including a base, a collector and an emitter electrode; means directly connecting together electrically the collector electrodes; means directly connecting the emitter electrode of the first transistor to the base electrode of the second transistor; means directly connecting the emitter electrode of the second transistor to the base electrode of the third transistor; asymmetric current conducting means connected between said first transistor base electrode and said second transistor base electrode; second asymmetric current conducting means connected between said first transistor base electrode and said third transistor base electrode; means connecting a source of signal potential to said third transistor emitter and said first transistor base electrode; and means connecting output means to said third transistor emitter and to said collectors.

References Cited in the file of this patent

UNITED STATES PATENTS

| | | |
|---|---|---|
| 2,624,016 | White | Dec. 30, 1952 |
| 2,644,894 | Lo et al. | July 7, 1953 |
| 2,663,806 | Darlington | Dec. 22, 1953 |